United States Patent
Ng et al.

(10) Patent No.: US 8,232,574 B2
(45) Date of Patent: Jul. 31, 2012

(54) LIGHT EMITTING PACKAGE WITH A MECHANICAL LATCH

(75) Inventors: Keat Chuan Ng, Penang (MY); Chiau Jin Lee, Penang (MY); Kheng Leng Tan, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 110 days.

(21) Appl. No.: 12/914,652

(22) Filed: Oct. 28, 2010

(65) Prior Publication Data

US 2012/0104436 A1     May 3, 2012

(51) Int. Cl.
*H01L 33/00* (2010.01)

(52) U.S. Cl. .............................. 257/98; 257/99; 257/100

(58) Field of Classification Search .................... 257/98, 257/99, 100
See application file for complete search history.

(56) References Cited

U.S. PATENT DOCUMENTS

| 7,264,378 B2 | 9/2007 | Loh |
| 7,458,705 B2 | 12/2008 | Chiba et al. |
| 2006/0157725 A1 | 7/2006 | Flaherty |
| 2008/0283856 A1 | 11/2008 | Weng |
| 2009/0310356 A1 | 12/2009 | Laporte |

*Primary Examiner* — Long Pham

(57) ABSTRACT

A surface mount light emitting device package with mechanical latching means for locking a lens on to the package is provided. The surface mount light emitting package may include an encapsulation layer or a lens, a lead frame, at least one lead, a body, a die, and a layer of transparent gel encapsulant material. The lead frame may include at least one protrusion which is bent upward to from at least one latch for engaging the lens.

20 Claims, 6 Drawing Sheets

LIGHT EMITTING PACKAGE WITH A MECHANICAL LATCH

BACKGROUND

Light emitting devices (herein after LEDs) have recently become widely used in many lighting applications, such as flashlights, traffic signals, automotive tail lights and display devices because the LEDs are known to provide a significantly higher power efficiency, smaller size and longer operating life compared to conventional incandescent lights.

Among the various packages for LEDs, the plastic leaded chip carrier (herein after PLCC) package for a surface mount device (herein after SMD) is one of the more popular packages for high power applications. For example, surface mount LEDs in a PLCC package may be used in automotive lighting and electronic signal lights. A typical SMD LED often comprises a lead frame over molded with a polymer material such as Polyphthalamide (PPA), Polyamide or Epoxy resin encapsulant like MG 97. Typically, an LED or die is disposed inside a reflective cup and attached to the lead frame using an adhesive and an electrical connection is established between the LED and lead frame by means of wire bonding. A transparent encapsulant, usually epoxy or silicone, is then injected into the cavity of the reflective cup so that the LED and wire is protected from the environment.

In many conventional SMD LED, a lens is utilized for shaping the light viewing angle and also to protect the gel type encapsulant within the package. Typically, a lens is attached to the top of the LED by means of an adhesive material. One drawback of this conventional LED design is that there is often poor adhesion between the lens and the body. Moreover, the adhesive material used to attach the lens to the LED may tend to degrade over time, especially given the repeated thermal cycling that high power LEDs tend to go through. In some cases, if the package is subjected to repeated thermal cycling, any differences or mismatches in thermal properties between the adhesive material, the LED die, and the lens material, may cause these materials to expand and contract differently, resulting in internal thermal stress. Such internal thermal stress may cause the adhesive material to degrade over time and the lens to detach from the package.

Another conventional SMD LED design may include a lens with a guided pin coupled to one or more guide holes in the package, where the guided pins and guide holes provide alignment for lens attachment as well as a mechanical interlocking means. Many times with this design, either an extra large package is required to accommodate the large lens with one or more guided pins, an adhesive is used in addition to the guide pins and guide holes to provide interlocking means, or both larger overall package and an adhesive are utilized. However, due to the large size of such a package design, the issues discussed above regarding adhesive degradation over time, and the complexity in its structure, such a system would not be reliable and may be susceptible to lens detachment over time.

In view of these concerns, there is a need for a compact package design for high power surface mount light emitting devices with enhanced attachment between the lens and the package and a method for making such a package.

BRIEF DESCRIPTION OF THE DRAWINGS

Throughout the description and figures, similar reference numbers may be used to identify similar elements.

DETAILED DESCRIPTION

Figure 1:
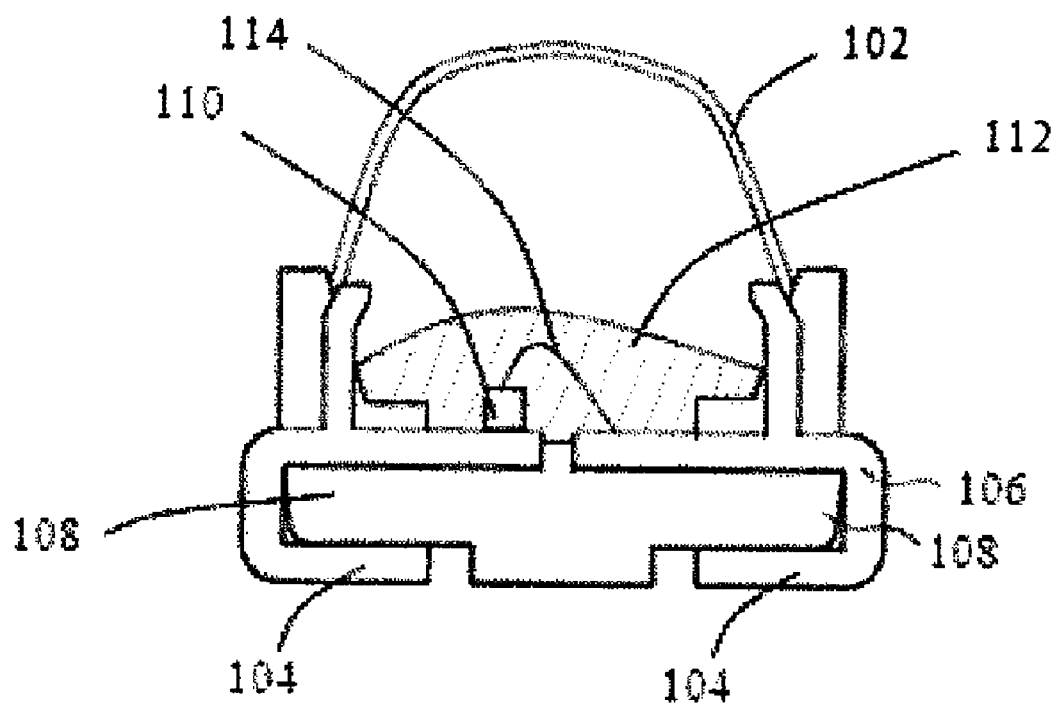
FIG. 1 illustrates a side, cut-away view of a surface mount light emitting device package.

FIG. 1 illustrates a side, cut-away view of a surface mount light emitting device package. In this embodiment, the surface mount device (SMD) light emitting device (LED) package 100 may be a plastic leaded chip carrier (PLCC) package 100, referred to hereinafter as the LED package 100. The LED package 100 may include an outer encapsulation layer 102, a plurality of leads 104, at least one lead frame 106, a body 108 and at least a die 110 that is operatively mounted on the lead frame 106 for emitting light. Although certain components of elements are illustrated in conjunction with the PLCC package in FIG. 1, the inventive features described herein may be applied to other types of packages. For example, the package may be a ball grid array package (BGA), a pin grid array package (PGA), a quad flat pack (QFP) or any other known surface mount technology package. As describe in more detail below, the LED package 100 may be designed to provide a locking mechanism for securing a lens or a hard protective layer on the top of the package without requiring any adhesive material. Thus, the LED package 100 may be manufactured with fewer processing steps. This has the added advantage that the adhesive cannot degrade over time, resulting in the lens potentially falling off of the package. In addition, the lens may be attached to the top of the LED package without increasing the overall size of the package.

The LED package 100 may include an encapsulation layer 102, a lead frame 106, at least one lead 104, a body 108, a die 110 and a layer of transparent encapsulant material 112. The LED package 100 may include at least one die 110 configured to generate light in response to applied drive current. Although the LED package 100 illustrated in FIG. 1 is shown as having only a single die 110, the LED package 100 may include multiple dies (not shown) to produce more light or light having different wavelengths, depending on the desired application. In an alternative embodiment, multiple dies 110 having various color combinations could also be utilized, depending on the application. The die 110 may be attached or mounted on one lead of the lead frame 106 by using any known die attach adhesive material (not shown) and electrically connected to a second lead of the lead frame via a wire bond 114. Wire bond 114 may be a gold, copper or other similar wire bond material, depending on the design.

Figure 2:
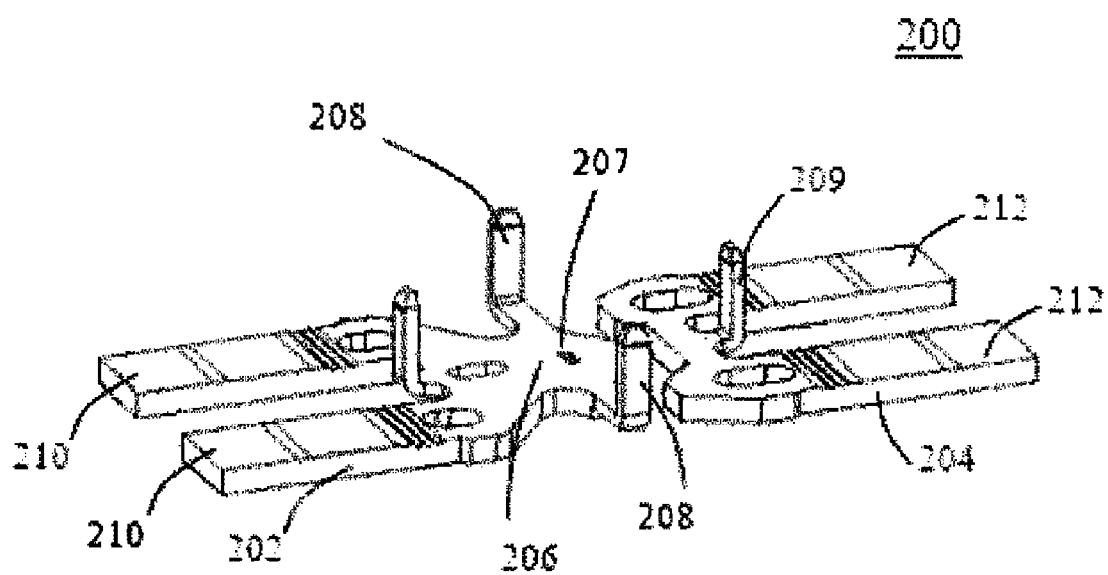
FIG. 2 illustrates a top, perspective view of a lead frame for use in a surface mount light emitting device package.

FIG. 2 illustrates a top perspective view of a lead frame 200 for use in the LED package 100. In one embodiment, the LED package 100 may include a first lead frame 202 and a second lead frame 204. In general, the lead frames 202 and 204 may be made of electrically and thermally conductive material, such as steel, copper, a metal, a metal alloy, a metal compound or other similar material. The lead frames 202 and 204 may be formed using any conventional stamping, cutting, etching or other similar process that is known in the art.

In one embodiment, the first lead frame 202 may include a first section 206 having a die mounting area 207 on which the die 110 (shown in FIG. 1) may be mounted. The first lead frame 202 may include at least one primary protrusion 208 extending from the first section 206, the primary protrusion 208 may be bent upwards and substantially perpendicular to the die mounting area 207, forming a latch 304 (shown in FIG. 3) for engaging the outer encapsulation layer 102 (shown in FIG. 1). Accordingly, the latch 304 may provide a locking mechanism for securing the outer encapsulation layer 102 or the lens on the top of the package. In another embodiment, the first lead frame 202 may also include one or more secondary protrusions 209, providing further locking mechanism. Hence, a lens may be attached to an LED package 100 without utilizing any adhesive material. Consequently, the lens dropping problem, which is normally caused by the degradation of adhesive material over time or due to thermal cycling may be avoided. The first lead frame 202 may include a plurality of leads 210 extending from the first section 206.

In one embodiment, the die 110 (shown in FIG. 1) may be mounted on the die mounting area 207 and electrically connected to the second lead frame 204 by wire bond 114 (shown in FIG. 1). The second lead frame 204 may also include at least a secondary protrusion 209, whereby the secondary protrusion 209 may be bent upwards and substantially perpendicular to the die mounting area 207, forming a secondary latch 305 (shown in FIG. 3). The secondary latch 305 may provide an additional locking mechanism to secure the outer encapsulation layer 102 or the lens on to the package. The second lead frame 204 may also include a plurality of leads 212.

Figure 3:
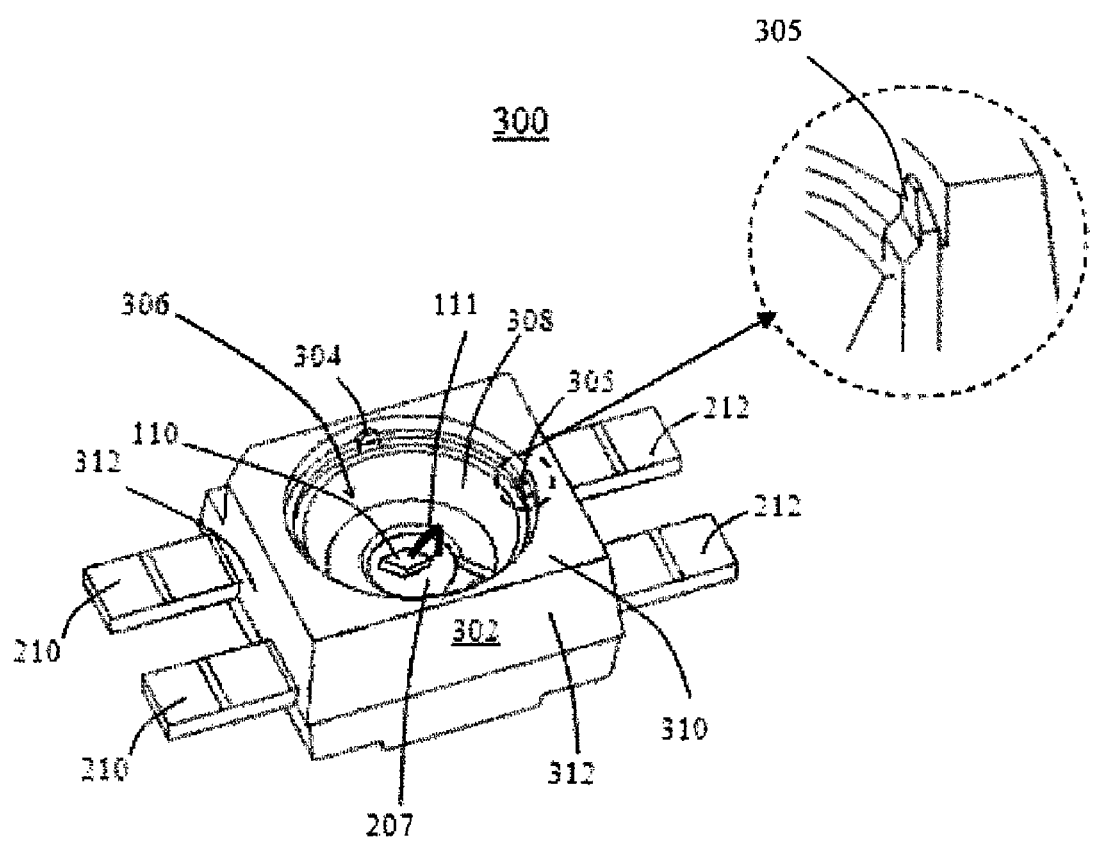
FIG. 3 illustrates a top, perspective view of a lead frame having an integral body.

FIG. 3 further illustrates a top, perspective view of a configuration of the lead frame 200 after further manufacturing. FIG. 3 shows the LED package 300 having an integral body 302. The body 302 may include an opening 306, a reflector cup 308, a top surface 310, a bottom surface 314 (shown in FIG. 5) and a plurality of side surfaces 312. In one embodiment, the body 302 may cover a substantial portion of the lead frame, exposing only the leads 210 and 212 and the tip of the protrusions (shown in FIG. 1 as 208 and 209) forming the latches 304 and 305. For example, referring to FIG. 1 and FIG. 3 together, a substantial portion of the first section 206 of the first lead frame 202 may be covered by the body 302 except the die mounting area 207. Additionally, a substantial portion of the primary protrusion 208 may also be embedded inside the body 302 with only the tip of the primary protrusion 208 exposed in the opening 306 to form the latch 304.

In one embodiment, the body 302 may be an integral single piece structure formed of an opaque material, such as a polymer material, a polyphthalamide (PPA), polyamide, epoxy resin encapsulant, MG 97, a plastic, or other similar material. The body 302 may be formed on the lead frames 200 using an injection molding process or any other known process. The body 302 may include an opening 306 extending from the top surface 310 to the die mounting area 207. In one embodiment, the body 302 may include a reflector cup 308, whereby the wall of the reflector cup 308 may be further coated with a reflective material (not shown) configured to reflect light generated by the light emitting die or dies 110 out of the package towards the opening 306.

As shown in FIG. 1 and FIG. 3, the reflector cup 308 may be filled with a layer of encapsulant material 112 for protecting the die or dies 110 and any wire bonds 114 from the environment. The encapsulant material 112 may be an epoxy, a polymer, silicon, or other similar substantially transparent material that may be injected into the cavity 306. The encapsulant material 112 may contain a luminescent material, such as a phosphor to convert the light generated by one or more LED dies 110 to light having a different spectrum. In one embodiment, the encapsulant material 112 may have a soft and tacky property that may be in a soft, gel like form, such as silicon or other similar material. For producing a high power LED device, it may be more desirable to use a soft gel for encapsulating the die 110 along with the wire bond 114, because such a material may tend to generate less stress to the die 110 and wire bond 114 when the LED device is subjected to hot and cold thermal cycling during operation. Accordingly, a high power LED device having an encapsulant layer made with a soft gel may, therefore, be more reliable and less susceptible to defects, such as die delamination and wire bond rupture.

Figure 4:
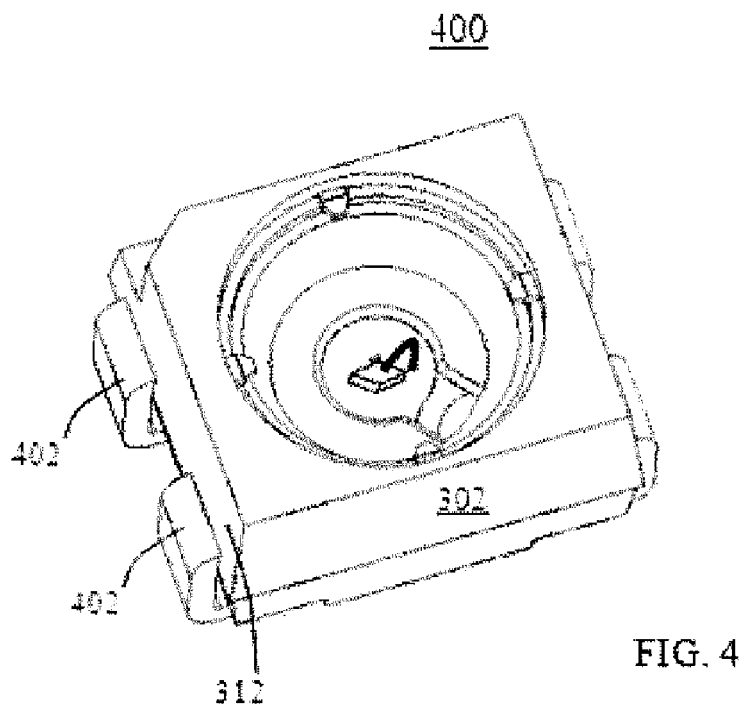
FIG. 4 illustrates a top, perspective view of a surface mount light emitting device package.
Figure 5:
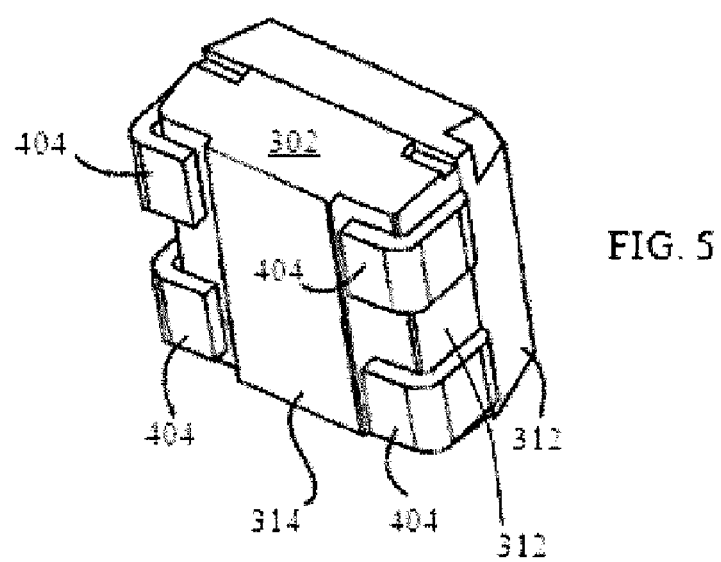
FIG. 5 illustrates a rear, perspective view of a surface mount light emitting device package.

Please refer now to FIG. 4 and FIG. 5. FIG. 4 illustrates a top, perspective view of an LED package 400 with a plurality of contact leads 402, which protrude through the body 302. In one embodiment, contact leads 402 may be bent along one of the side surfaces 312 of the body and terminate in a contact pad 404 on the bottom surface 314 of the body 302. As illustrated in FIG. 5, which is a bottom, perspective view of the LED package 400, each contact lead 402 may be bent along one of the side surfaces 312 of the body 302 to form a contact pad 404 on the bottom surface 314. The contact pad 404 may provide an adequate electrical contact for attaching the LED package 400 to a printed circuit board (not shown) of an electrical device (not shown). The contact leads 402 may provide an electrical connection for mounting the LED package 400 to a device and may also provide an effective heat conducting path for dissipating heat generated by the one or more LED dies 110. In one embodiment, the contact leads 402, shown in FIG. 4 and FIG. 5 are J-leads, which are typically used for an SMD LED. However, other leads, such as SOJ leads, gull wing leads, reverse gull wing leads and straight cut leads may also be used in other embodiments of this invention.

Figure 6:
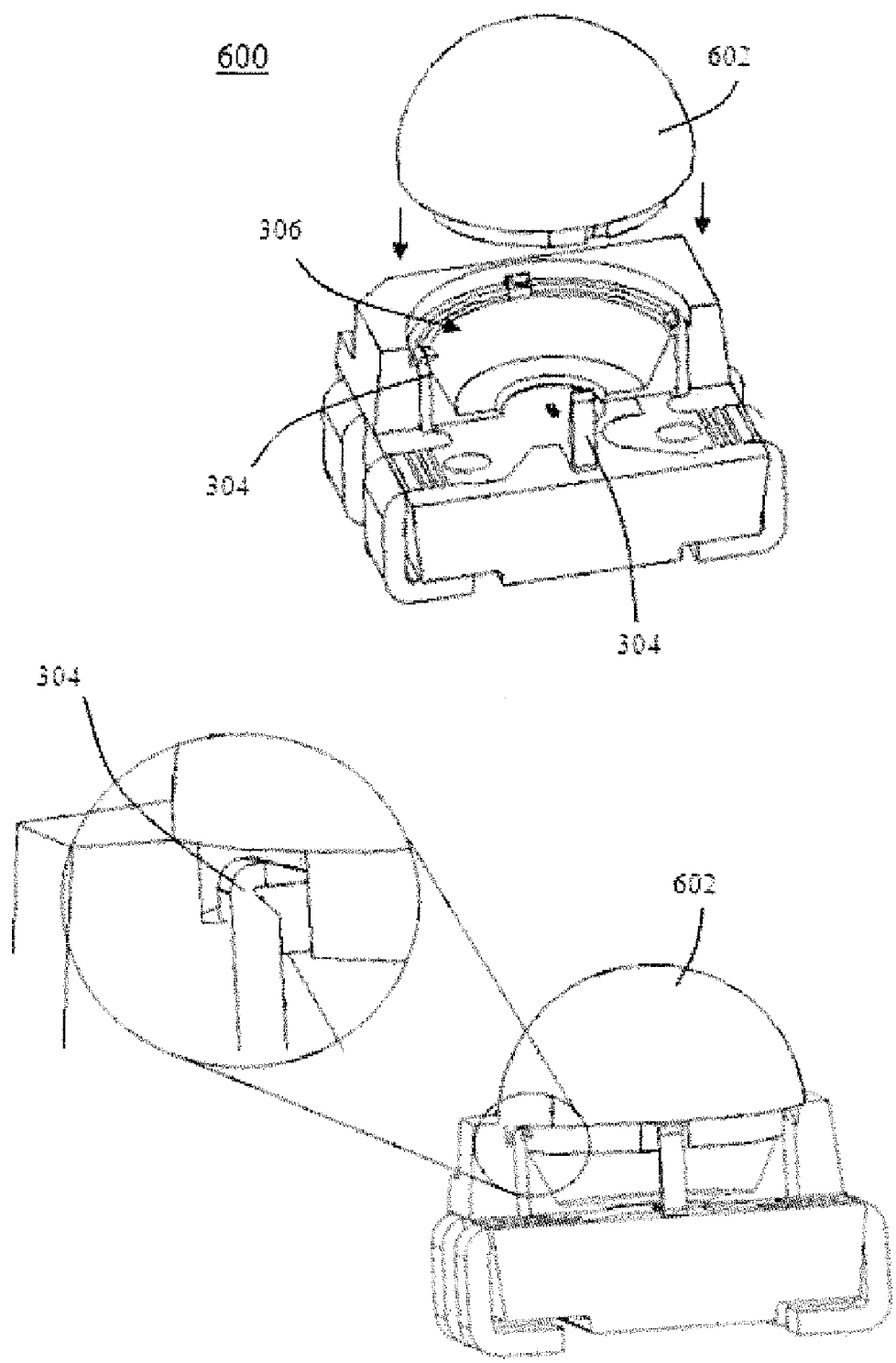
FIG. 6 illustrates a partially cut-away, perspective view of a surface mount light emitting device package with lens.

FIG. 6 illustrates a partially cut-away perspective view of an LED package 600 with a lens 602. In one embodiment, the package 600 may include an outer encapsulation layer or a lens 602 operatively attached to the LED package 600 configured to provide a hard protective cover. In one embodiment, the tip of the protrusion 304 that is exposed in the opening 306 may provide a latch 304 for securing the lens 602 onto the top of the LED package 600. The latch 304 may be further bent to form a hook type locking mechanism for holding the lens 602 in a fixed, secured position. The lens 602 may be installed on to the LED package 600 by snapping a lip of the lens 602 on to the latch 304, such that the lens attaches mechanically in a snap fit manner. Alternatively, the lens or outer encapsulation layer 602 may have a lower flange or lip that is configured with one or more holes to slip over the one or more latches 304 and then the encapsulation layer or lens 602 is twisted until the lip or flange engages the one or more latches 304, resulting in the encapsulation layer or lens 602 being mechanically locked on to the one or more latches 304. As the lens is attached in such a mechanical locking manner, the risk of the lens dropping off of the LED package, which is typically caused by adhesive degradation and thermal mismatch, may be significantly reduced or avoided entirely.

Figure 7:
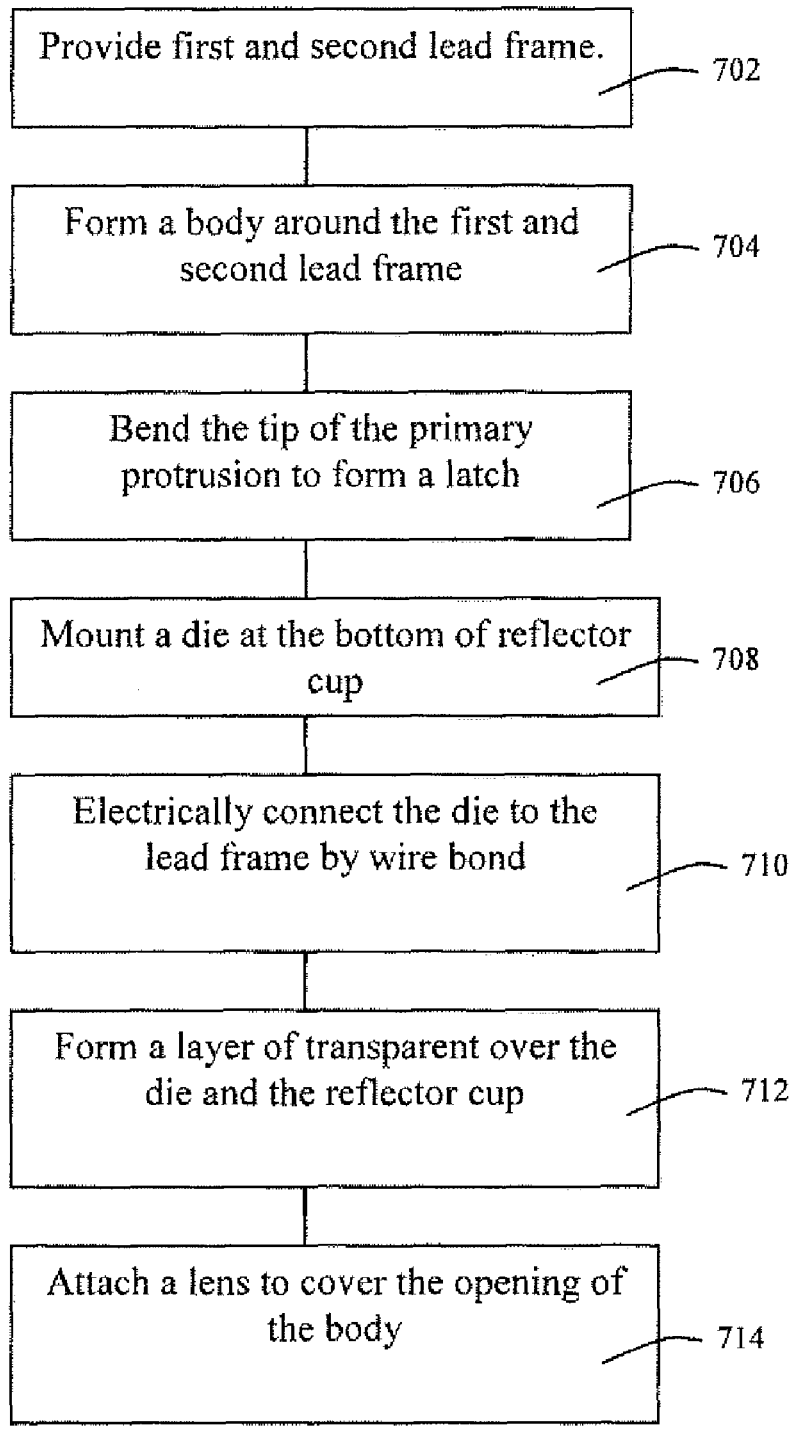
FIG. 7 illustrates a flow chart of a method for making a surface mount light emitting device package.

FIG. 7 illustrates a process flow chart of a method 700 for making a surface mount light emitting device package. At block 702, a first lead frame 202 and a second lead frame 204 are provided. In one embodiment, the first lead frame 202 may comprise a plurality of leads 210 and at least one primary protrusion 208, which may be bent vertically upward to form a latch 304. The first lead frame may also comprise at least one secondary protrusion 209, which may be bent vertically upwards to form a latch 305. The second lead frame 204 may comprise at least one lead 212. The second lead frame 204 may also comprise at least one secondary protrusion 209, which may be bent vertically upward to form a latch 305.

At block 704, a body 302 is formed around the first and the second lead frames 202 and 204, whereby a tip portion of the at least one primary protrusion 208 of the first lead frame 202 and all the leads 210 and 212 are exposed through the body 302. In one embodiment, the body 302 may be an integral single piece structure comprising an opening 306 and a reflector cup 308. In another embodiment, the body 302 may be formed by means of an injection molding process.

At block 706, the tip portion of the at least one primary protrusion 208 is bent to form the at least one latch 304. In one embodiment, the tip portion of the primary protrusion 208 may be bent to form a hook type locking mechanism for holding the lens 602 in a position. In an embodiment, the tip of at least one secondary protrusion is bent to form a hook type locking mechanism for providing further locking means to the lens 602.

At block 708, a die 110 is mounted and electrically connected to a die mounting area of the first or second lead frames at the bottom of the reflector cup 308. At block 710, an electrical connection is made from the die to the second lead frame 204. In one embodiment, a wire bond is used to establish the electrical connection.

At block 712, a layer of transparent material 112 is formed covering the die 110 and at least partially the reflector cup 308. In one embodiment, the encapsulant material 112 may be injected through the opening 306 into the reflector cup 308. The encapsulant material 112 may be in soft, gel form and may include an epoxy, a polymer, a silicon or other similar substantially transparent materials or compounds. The encapsulant may also include a wavelength transforming additive. At block 714, an outer encapsulation layer 102, 602 is mechanically attached to cover the opening 306 of the body 302. In one embodiment, the outer encapsulation layer 102 may include or comprise a lens for providing hard protective cover with light collimation.

Although the operations of the methods herein are shown and described in a particular order, it will be understood by those skilled in the art that other modifications and variations may be possible in light of the above teachings. For example, the LED die may be mounted before the primary protrusion tip is bent to form a latch. Although specific embodiments of the invention have been described and illustrated, the invention is not to be limited to the specific forms or arrangements of parts so described and illustrated. For example, different types of surface mount packages may be utilized, other than a PLCC. Also, more than one LED die may be attached within the reflector cup. The scope of the invention is to be defined by the claims appended hereto and their equivalents.

What is claimed is:

1. A light emitting package comprising:
   an outer encapsulation layer;
   a first lead frame with a first section having a die mounting area;
   at least one primary protrusion extending from the first section, the at least one primary protrusion being bent upward and substantially perpendicular to the die mounting area, forming at least one primary latch for engaging the outer encapsulation layer;
   at least one lead extending from the first section of the first lead frame;
   a second lead frame having at least one lead extending therefrom;
   a body having a top surface, a bottom surface and a plurality of side surfaces, wherein the top surface of the body has an opening and a reflector cup, wherein the reflector cup extends from the opening in the top surface of the body to the die mounting area of the first section of the first lead frame; and
   at least one die operatively mounted on the die mounting area of first lead frame and electrically connected to the second lead frame by a wire bond, wherein the die is mounted within the reflector cup.

2. The light emitting package of claim 1, wherein the first and second lead frames are embedded in the body such that all the leads protrude from the body, wherein each lead is bent along one of the plurality of side surfaces of the body and terminates in a contact pad on the bottom surface of the body.

3. The light emitting package of claim 1, wherein the primary protrusion is bent upward and substantially perpendicular to the at least one die mounting area comprising a tip portion exposed outside the body.

4. The light emitting package of claim 3, wherein the tip portion of the primary protrusion is exposed at or near the opening in the top surface of the body.

5. The light emitting package of claim 3, wherein the tip portion of the primary protrusion is bent to form the at least one primary latch, wherein the at least one primary latch is substantially rigid and configured to secure the outer encapsulation layer in a fixed position.

6. The light emitting package of claim 1, wherein the outer encapsulation layer comprises a lens.

7. The light emitting package of claim 1, wherein the outer encapsulation layer comprises a protective cover.

8. The light emitting package of claim 1, further comprising a layer of transparent encapsulant material covering the at least one die and filling at least a portion of the reflector cup.

9. The light source of claim 8, wherein the transparent material comprises a silicon gel.

10. The light emitting package of claim 1, wherein the second lead frame further comprises at least one secondary protrusion, the at least one secondary protrusion being bent upward and substantially perpendicular to the at least one die mounting area forming at least one secondary latch for engaging the outer encapsulation layer.

11. The light emitting package of claim 1, wherein the body comprises an integral single piece structure formed of an opaque material.

12. The light emitting package of claim 11, wherein the body comprises a molded plastic body.

13. The light emitting package of claim 1, wherein the reflector cup comprises a reflective wall configured to direct light emitted by the at least one die towards the opening in the top surface of the body.

14. The light emitting package of claim 1, wherein the leads of the first lead frame and the second lead frame comprises leads selected from a group consisting of J leads, SOJ leas, gull wing leads, reverse gull wing leads and straight cut leads.

15. The light emitting package of claim 1, wherein the outer encapsulation layer is configured to snap fit into a locked position with the at least one primary latch.

16. The light emitting package of claim 1, wherein the outer encapsulation layer is configured to twist fit into a locked position with the at least one primary latch.

17. The light emitting package of claim 10, wherein the outer encapsulation layer is configured to lock with the at least one primary latch and the at least one secondary latch.

18. A light emitting device comprising:
   an outer encapsulation layer;

an integral body comprising an opening and a reflector cup;

a lead frame comprising a die mounting area, a plurality of leads and a plurality of protrusions, the plurality of protrusions being bent upward substantially perpendicular to the die mounting area, forming a plurality of latches configured to engage the outer encapsulation layer;

at least one die operatively connected to the lead frame in the die mounting area; and a layer of transparent material covering the die and filling at least a portion of the reflector cup;

wherein the lead frame is embedded in the integral body with a portion of the plurality of leads and a tip portion of the plurality of protrusions exposed outside the body.

19. The light emitting device of claim 18, wherein the tip portion of the plurality of protrusions is exposed at the opening of the body, forming a plurality of latches configured to engage the outer encapsulation layer.

20. The light emitting device of claim 18, wherein the outer encapsulation layer comprises a lens configured to provide a protective cover to the at least one die.

* * * * *